United States Patent [19]

Whitley

[11] Patent Number: 4,462,435
[45] Date of Patent: Jul. 31, 1984

[54] APPARATUS FOR SECURING A COMPONENT TO A PRINTED CIRCUIT BOARD

[75] Inventor: George J. Whitley, Philadelphia, Pa.
[73] Assignee: RCA Corporation, New York, N.Y.
[21] Appl. No.: 455,992
[22] Filed: Jan. 6, 1983
[51] Int. Cl.³ ............................................. B21F 11/00
[52] U.S. Cl. ........................................ 140/105; 29/741
[58] Field of Search ................. 140/71 R, 93 D, 105; 29/564.1, 741

[56] References Cited

U.S. PATENT DOCUMENTS

| | | | |
|---|---|---|---|
| 2,840,134 | 6/1958 | Rayburn et al. | 153/17 |
| 2,884,210 | 4/1959 | Strauss | 242/7 |
| 2,893,006 | 7/1959 | Stuhre | 1/60 |
| 3,333,857 | 8/1967 | Lindgren | 279/114 |
| 4,125,136 | 11/1978 | Olcese et al. | 140/105 |
| 4,151,637 | 5/1979 | Zemek et al. | 140/105 |
| 4,227,395 | 10/1980 | Plavsity | 72/402 |
| 4,288,914 | 9/1981 | Vancelette | 140/105 |

*Primary Examiner*—Lowell A. Larson
*Attorney, Agent, or Firm*—Joseph S. Tripoli; George E. Haas; William Squire

[57] ABSTRACT

A component element bending apparatus includes a pair of bending jaws which are radially displaced by spiral and radially extending camming slots in adjacent respective rotatable drive and stationary discs when the rotatable drive disc is activated. The rotatable disc is driven by a drive lever coupled to an air-operated drive plate.

6 Claims, 9 Drawing Figures

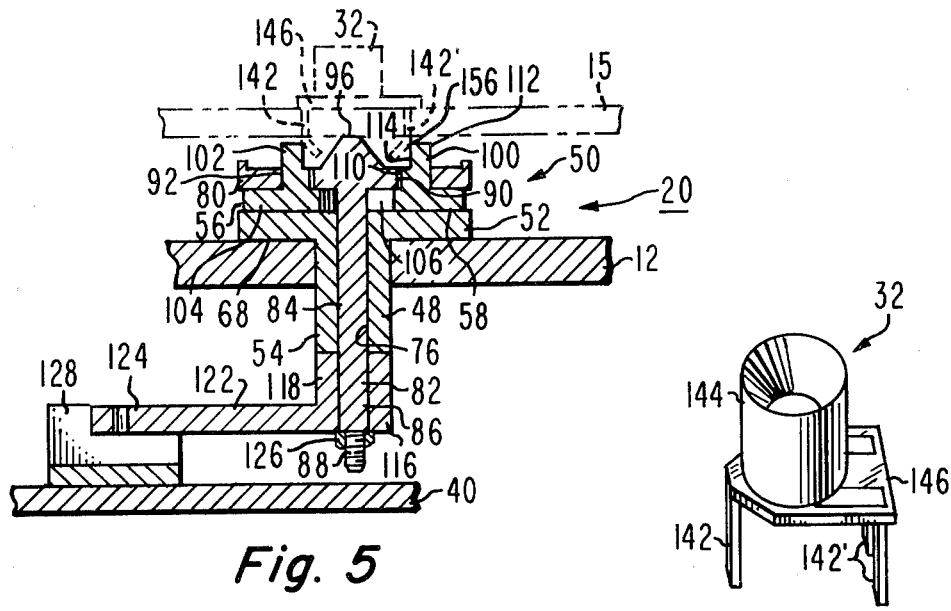
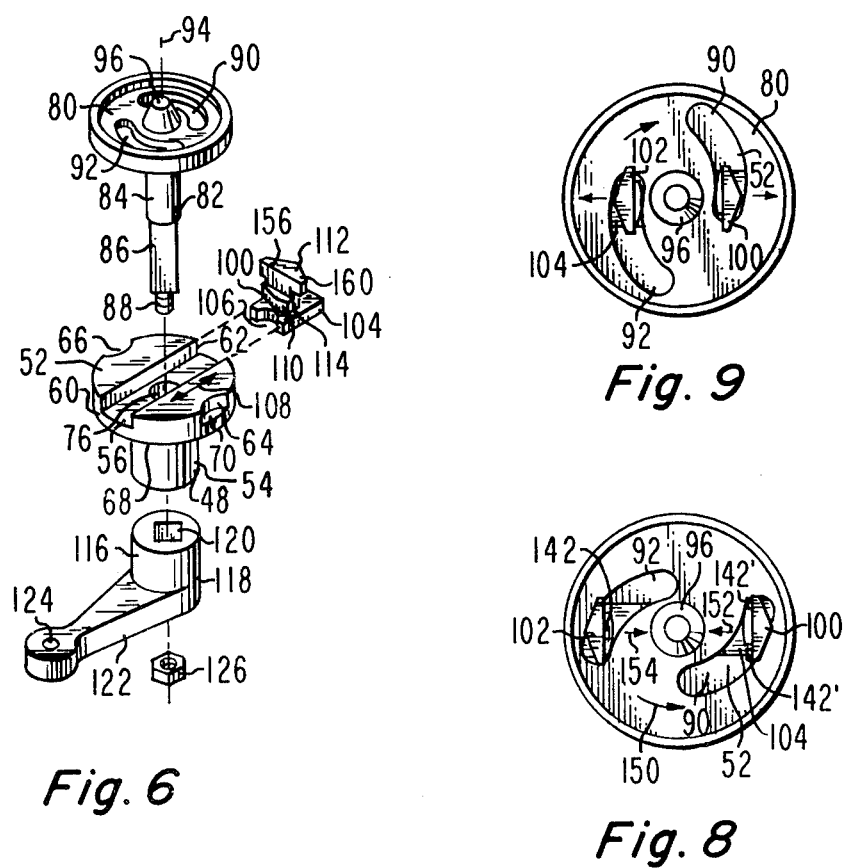

APPARATUS FOR SECURING A COMPONENT TO A PRINTED CIRCUIT BOARD

This invention relates to apparatus for bending the leads, tabs, or other elements of a component on a printed circuit board for securing the component to the board.

Printed circuit board assemblies comprise printed circuit board substrates to which are secured electrical components such as resistors, capacitors, transistors, transformers, and so forth. The components have leads which are to be electrically conductively connected to selected conductors on the printed circuit board for completing a circuit. Some components, such as transformers, have housings from which extend tabs which may be employed to secure the transformer to the printed circuit board and the leads connect the transformer electrically to the conductors on the printed circuit board. With respect to the other components the leads therefore serve dual purposes in electrically connecting the component to the conductors and for mechanically securing the component to the board.

The process of assembling components to a printed circuit board includes the initial step of securing the component to the board by inserting the leads or tabs through holes in the board substrate. The board is then conveyed to a wave soldering apparatus for soldering the component leads to the conductors on the printed circuit board. The components, while being conveyed, tend to fall from the board and therefore the leads and tabs are bent to secure the components to the boards prior to application of the solder. With respect to component leads such as resistors, transistors, and the like, apparatus for both trimming the component leads and for bending the leads to secure the component to the boards are known. By way of example, reference is made to my allowed copending application Ser. No. 075,585, filed Sept. 14, 1979, entitled "System for Securing Component Leads to Printed Circuit Boards," now U.S. Pat. No. 4,377,026 granted Mar. 22, 1983 and assigned to the assignee of the present invention. Disclosed therein is apparatus for bending the leads to secure the components to the printed circuit board and apparatus for cutting and bending the component leads. Reference is also made to U.S. Pat. No. 2,840,134 which discloses a module mounting device having cam actuated, pivotally mounted tab bending arms, and U.S. Pat. No. 2,893,006 which discloses a method of securing components to a printed wire panel.

With respect to the leads on certain components such as transistors, capacitors, resistors, these leads tend to be thin and circular in cross-section wires which usually can be bent in any direction. Prior art devices for cutting and/or bending the leads are especially suitable for such circular wires. With respect to tab elements, depending from the housings of transformers and other similar components, these usually are plane sheet metal and can easily be bent on only certain directions, e.g., normal to the plane of the sheet. The prior art devices for bending circular wires are not easily adapted for bending such transformer tab elements.

According to the present invention, apparatus for securing a component to a printed circuit board comprises a support structure and at least one component element bending assembly. Means are secured to the support structure for aligning a printed circuit board relative to the bending assembly. The bending assembly comprises a stationary first member secured to the support structure and a second member rotatable about an axis relative to the first member. The first member has at least one radially extending slot extending in a given direction relative to the support structure, and the second member has at least one spirally extending slot extending away from the axis and corresponding to and overlying the radially extending slot. A component bending member has a base portion in the radially extending slot, a camming portion in the spirally extending slot, and an element bending portion projecting from the slots whereby upon relative rotation of the first and second members, the bending member is linearly displaced in the radially extending slot in the given direction. Drive means rotate the second member relative to the first member about the axis.

In the drawing:

FIG. 5 is a sectional view along lines 5—5 of FIG. 1 illustrating one embodiment of a component element bending assembly;

FIG. 6 is an exploded view of the bending assembly of FIG. 4;

FIG. 7 is an isometric view of a component whose lead elements may be bent by the bending assembly of the apparatus of the present embodiment; and FIGS. 8 and 9 are plan views of the bending assembly of FIG. 4 illustrating different stages of the component element bending process.

Figure 1:
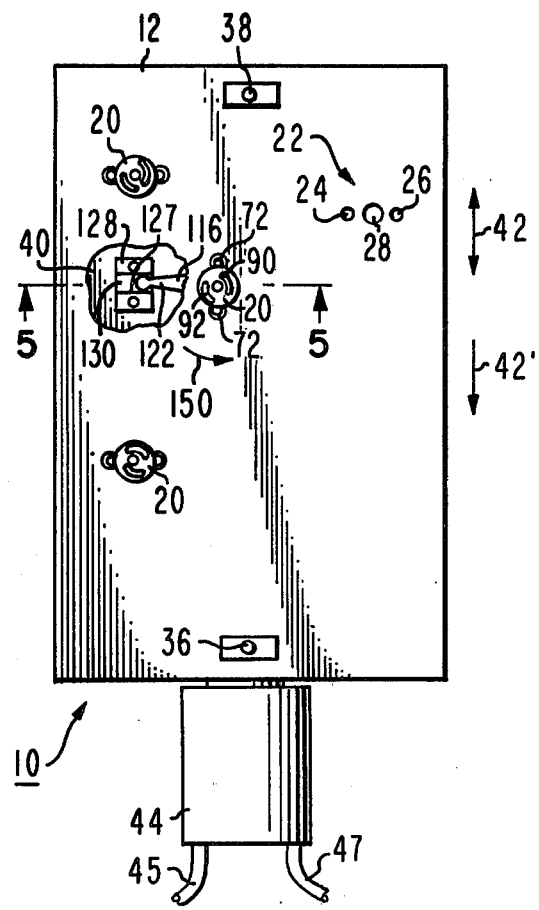
FIGS. 1 and 2 are plan and elevation views, respectively, of a component element and bending apparatus in accordance with one embodiment of the invention.
Figure 2:
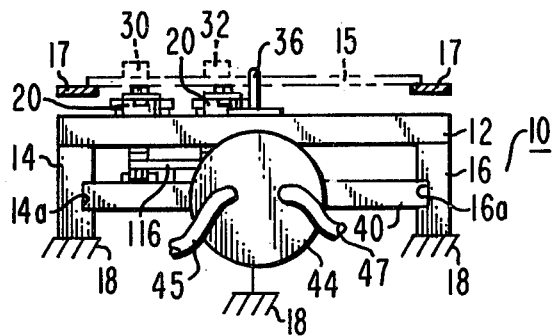

In FIGS. 1 and 2 a component lead or tab bending system 10 includes a support structure comprising a plate 12 and a pair of frame members 14 and 16 to which the plate 12 is secured. Plate 12 is shown partially broken away in FIG. 1 to illustrate details to be hereinafter described. As represented by the symbols 18, FIG. 2, the frame members 14 and 16 are secured to stationary structural members (not shown) such as a conveyor supporting structure in a factory assembly line. At least one, but typically a plurality of component lead and tab element bending assemblies 20, to be described in more detail hereinafter in connection with the description of FIGS. 3-6, are secured to plate 12. Three such bending assemblies are shown in FIG. 1. A printed circuit board 15 as shown in phantom in FIG. 2, is conveyed over the apparatus 10, plate 12 by a conveyor 17 which may comprise a pair of parallel conveying belts which may also be supported to the conveyor supporting structure represented by the symbols 18.

In region 22 of plate 12 (FIG. 1) are apertures in the plate for accepting a fourth element bending assembly. Apertures 24 and 26 are threaded to accept screws to secure a bending assembly 20 to plate 12. A portion of a bending assembly 20 when installed extends through center aperture 28. Apertures similar to apertures 24, 26, and 28 are located in plate 12 for each bending assembly 20.

The bending assemblies 20 are positioned on plate 12 at locations corresponding to the location of components on printed circuit board 15 (illustrated in phantom in FIG. 2) whose wire leads or tabs or other protruding elements are to be bent for securing the component to the printed circuit board. For example, components 30 and 32 of FIG. 2 are placed directly above two of the bending assemblies 20, FIG. 1. The printed circuit board 15 (FIG. 2) is positioned relative to plate 12 by locating pins 36, 38 (FIG. 1) which are secured to plate 12. Printed circuit board 34 has locating apertures (not shown) which match the location of pins 36 and 38.

A movable plate 40 (FIG. 2) slides in frames 14 and 16 respective guide slots 14a and 16a parallel to and spaced from plate 12. Motion of plate 40 is in directions 42, FIG. 1, parallel to the plane of plates 12 and 40. Air cylinder 44, FIG. 2, which is mechanically secured to the structure to which frames 14 and 16 are secured, moves plate 40 via a mechanical linkage (not shown). Air cylinder 44 operates in response to pressurized air supplied in one or the other of hoses 45 and 47. Other power devices may be employed in alternative to the air cylinder 44. Plate 40 imparts simultaneous rotary motion to the bending parts of assemblies 20, as will be described below in more detail.

Figure 3:
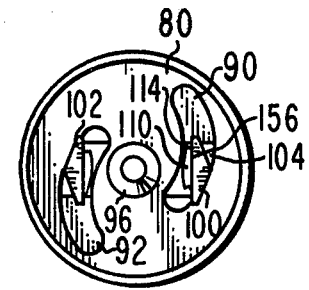
FIG. 3 is a plan view of an element bending assembly portion of the apparatus of FIG. 1.
Figure 4:
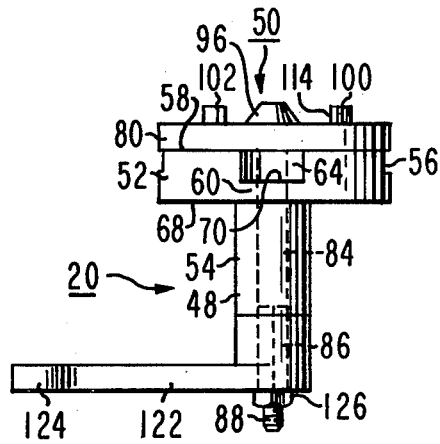
FIG. 4 is a side elevation view of an element bending subassembly of the apparatus of FIG. 1.

In FIGS. 3-6, bending assembly 20 comprises a stationary member 48 and a movable assembly 50. In FIGS. 4, 5, and 6 the stationary member 48 includes a head 52, and a shaft 54. The head 52 comprises a disc-like member having a centrally positioned slot 56 extending across the upper surface 58 from edge 60 to edge 62. A pair of semi-circular grooves 64, 66 are on diametrically opposite sides of the head 52 extending partially from the upper surface 58 toward the lower surface 68. The slots 64 and 66 each have a shoulder 70 by which the fixed member 48 can be secured to the plate 12 by screws 72, FIG. 1. Shaft 54 is a circular cylinder and depends from the head 52. The shaft 54 has a circular cylinder opening 76 that passes centrally through shaft 54 and head 52, terminating centrally in the slot 56. As seen in FIG. 5, shaft 54 depends below the plate 12 and the head 52 surface 68 abuts the upper surface of plate 12. Screws 72 securely fasten member 48 to the plate 12 via threaded holes 24 and 28 in plate 12, FIG. 1.

Movable assembly 50 includes a rotatable disc-like camming member 80, FIG. 6, from which depends shaft 82, the upper portion of which comprises a circular cylinder 84 and the lower portion of which is formed into a drive element 86 having a square section from which depends a threaded stud 88. Disc-like member 80 is formed with two spiral slots 90 and 92 which may be of identical dimensions. Slots 90 and 92 spiral with respect to the axis 94 about which the shaft 82 and disc-like member 80 rotate. In the central region along axis 94 is an upwardly projecting button 96 which abuts printed circuit board 15, FIG. 5, when the components on the printed circuit board 15 are to be secured to the board and are in alignment with the assembly 20. The cylinder 84 is closely received in opening 76 and rotates about axis 94. The square section portion 86 depends below the shaft 54.

Movable assembly 50, FIG. 4, also includes two lead and tab element bending jaw members 100 and 102, which may be identical. In FIG. 6 jaw member 100 comprises a base plate 104 having a semi-circular cut-out 106. Plate 104 is closely received in the slot 56 of disc-like member 80 so that the jaw member can reciprocate in directions 108. Base plate 104 serves as a cam follower in slot 56. In one position of the base plate 104 the cut-out 106 overlies and is aligned with the cylindrical shaft opening 76 in the member 48. This occurs when the jaw member 100 is at its left-most position in FIG. 6 of directions 108. Upstanding from plate 104 is a cam 110 which slides in the spiral slot 90. In FIG. 5 the cam 110 is closely received in the slot 90 so as to follow the path of the slot 90 as the disc-like member 80 is rotated about axis 94. Secured above the cam 110 is a jaw 112 having a planar jaw face 114, FIG. 6. The jaw 112 engages the leads, tabs, or other elements of a component for bending those elements with respect to the printed circuit board 15. The cam face of cam 110 on the surfaces abutting the side walls of slot 90 are arcuate to smoothly follow the path of the spiral of slot 90 as slot 90 rotates relative to slot 56. The other jaw 102 has a base plate corresponding to plate 104 in slot 56 and is oriented so that its jaw bending surface corresponding to surface 114 is parallel to and faces surface 114 of jaw member 100.

Plate 104 of jaw member 100 and the corresponding plate of jaw member 102 are between disc-like member 80 and the bottom surface of groove 56, FIG. 6. Thus, the jaw members are locked in place once the shaft 82 is in place within the member 48.

After the member 48 is secured in place to the plate 12, as described above, the jaw members 100, 102 are placed in position in the slot 56, one on each side of the cylindrical opening 76. Shaft 82 of the movable assembly 50 is then inserted into the opening 76 with the bending jaw 112 inserted in slot 90. Jaw 112 passes through the slot 90 until the cam 110 is coplanar with the disc-like member 80. The other bending jaw member 102 is simultaneously inserted similarly into its corresponding slot 92. After the shaft 82 is inserted in the shaft opening 76 of the fixed member 48, drive member 116 is attached to the square portion 86 of shaft 82. Drive member 116 includes a cylindrical portion 118 having a square opening 120 which closely receives the square portion 86 of the shaft 82. Extending from the cylindrical portion 118 is a drive lever 122 having a camming end 124. A nut 126, FIG. 5, is threaded to threaded stud 88 of shaft 82 for securing the drive member 116 to shaft 82. The lever 122 is generally parallel to and spaced from the plate 40, FIG. 5. Camming end 124 of lever 122 has an arcuate shape.

A slotted bracket 128, FIG. 1, is attached to plate 40, FIG. 1. Bracket 128 has a slot 130 normal to directions 42 of movement of plate 40. Cam end 124 of lever 122 slides in slot 130. Thus, as plate 40 is moved back and forth in directions 42 this motion moves the lever 122 in directions 42 pivoting member 116 about the axis of rotation 94 of shaft 82, rotating the disc member 80 relative to the stationary head 52. In the alternative, other operating mechanisms may be employed for rotating the disc-like member 80 relative to the stationary head 52. Such other mechanisms may employ, for example, rack and pinions or other types of linkages. Typically, however, only one type would be used in a particular implementation for all of the bending assemblies 20, FIG. 1.

The bending assemblies 20, FIG. 1, are secured to plate 12 with the slots 90, 92 aligned with the corresponding component leads or tabs on the printed circuit board 15. More particularly, the bending members 100 and 102, FIG. 3, are aligned so that the leads or tabs to be bent are between the facing jaw surfaces of the members 100 and 102. This is shown in phantom in FIG. 5 with a component 32 in place. Lead 142 is being bent by the bending jaw of member 102 and a pair of leads 142' are being bent by the jaw of member 100. Component 32 is shown in more detail in FIG. 7. The component comprises a transformer member 144 which is attached to a thin substrate insulating sheet 146. Leads 142 and 142' are flat sheet metal elements. There are two leads 142' and a single lead 142, as shown. The leads 142' are engaged simultaneously by the jaw member 100 while the lead 142 is simultaneously engaged by the jaw 102.

In FIG. 8 the jaw of member 100 is abutting or closely spaced from the broad surfaces of the leads 142' and the jaw 102 abuts or is closely spaced from the broad surface of lead 142. In operation, the air cylinder 44, FIG. 2, operates the plate 40 to move it in one of directions 42. In the case of FIG. 8, the plate 40 moves in direction 42', FIG. 1. This action moves the member 116 of FIG. 5 in a counterclockwise direction 150 about the axis 94, FIG. 6. The rotation of the member 80 in direction 150, FIG. 8, rotates the spiral slots 90 and 92 such that they spirally approach toward axis 94 which causes the jaw members 100 and 102 to linearly displace inwardly in slot 56 toward each other in directions 152, 154. As a result, the upper edge 156 (FIG. 6) of member 100 which is a sharp corner engages the leads 142', FIG. 5, adjacent the undersurface of printed circuit board 15 and pushes on those leads toward the axis 94, FIG. 6, bending the leads against the printed circuit board 15 undersurface. Simultaneously the other jaw 102 is bending the lead 142 in a similar way in the opposite direction.

When the jaw members 100, 102 reach their inwardmost position as shown in FIG. 9 the top surface 160 of the bending face 114, FIGS. 5 and 6, wipes the leads against the undersurface of printed circuit board 15, firmly securing the lead and the component 140 to the printed circuit board. In similar fashion, the jaw member 102 secures the lead 142 to the printed circuit board 15 in the opposite direction from that of jaw member 100 on leads 142'. The upper surfaces of the jaws 112 of the members 100 and 102 are spaced from the undersurface of the printed circuit board 15 by the projection 96 to provide clearance for the bent-over lead portions. After the bending of the leads, the air cylinder 44, FIG. 1, returns the member 116 to its beginning position and returns the jaws 112, members 100 and 102 to the position of FIG. 8.

By selectively shaping the jaws, such as jaws of members 100 and 102, tabs of components of transformers may be bent while not bending the adjacent leads if such be desired. For example, edge 156 may be divided into spaced jaw bending teeth, each tooth corresponding to a separate tab. The spaces between the teeth receive the leads which are not bent.

It is important that the action of the jaw members 100, 102 moving in radial directions 152, 154, FIG. 8, be sufficient to completely bend the leads or tab elements to firmly secure the components to the printed circuit board. While the surface 114 of the jaw member 100, FIG. 6, need not be planar, the upper edge 156 should be straight and generally perpendicular to the direction of movement of the jaw member, for example, in directions 108, FIG. 6. It is the upper corner 156 which actually engages the leads and tabs or other elements and bends them. For this reason, the surface 114 could, in some implementations, taper, if necessary, so that the surface 114 slopes at some angle other than the vertical.

What is claimed is:

1. Apparatus for securing a component to a printed circuit board comprising:
   a support structure;
   at least one component element bending assembly;
   means secured to the support structure for aligning a printed circuit board relative to said bending assembly;
   said bending assembly comprising a stationary first member secured to the support structure and a second member rotatable about an axis relative to said first member, said first member having at least one radially extending slot extending in a given direction relative to said support structure and the second member having at least one spirally extending slot extending away from said axis and corresponding to and overlying the radially extending slot, a component bending member having a base portion in said radially extending slot, a camming portion in said spirally extending slot and an element bending portion projecting from said slots to be adjacent said printed circuit board whereby upon relative rotation of said first and second members, said bending member is linearly displaced in said radially extending slot in said given direction as said camming portion follows said spirally extending slot; and
   drive means coupled to said second member for rotating the second member relative to the first member about said axis.

2. The apparatus of claim 1 wherein said first member has a cylindrical opening whose longitudinal axis is concentric with said axis and said second member includes a shaft closely received in the opening for rotation about said axis, said drive means including means coupled to said shaft for selectively rotating said shaft in either of two opposite directions about said axis.

3. The apparatus of claim 1 wherein said assembly includes a pair of spirally extending slots and an associated pair of bending members in spaced relation with respect to said axis whereby said bending members simultaneously displace in opposite directions parallel to said given direction in response to said relative rotation.

4. The apparatus of claim 1 wherein said first member comprises a body and a first disc-like element secured to one end of the body and has a radially extending slot extending edge to edge across said disc-like element, said second member comprises a shaft rotatably secured in a cylindrical opening in said body for rotation about an axis parallel to the longitudinal axis of said cylindrical opening and a second disc-like element secured to one end of said shaft parallel to the first disc-like element, said second element having a pair of said spirally-extending slots on opposite sides of the axis of rotation of said shaft, and a pair of bending elements, one in each spiral slot, said bending element first portions being between facing surfaces of said first and second disc-like elements, and the second portions being in the corresponding spirally-extending slot, and means secured to the shaft for rotating the shaft about said axis.

5. The apparatus of claim 1 wherein said element bending portion has a planar surface oriented perpendicular to said given direction.

6. The apparatus of claim 1 wherein said element bending portion has a bending surface which abuts said component element during said bending, said base portion and camming portions being adapted to minimize the spacing of said bending surface to said axis in one position of said bending member.

* * * * *